United States Patent
Jau et al.

(10) Patent No.: US 9,462,725 B2
(45) Date of Patent: Oct. 4, 2016

(54) SERVER RACK AND ITS SERVER DEVICE

(71) Applicant: Quanta Computer Inc., Taoyuan Shien (TW)

(72) Inventors: Maw-Zan Jau, Taipei (TW);
Chao-Jung Chen, New Taipei (TW);
Yaw-Tzorng Tsorng, Taipei (TW);
Chih-Wei Lin, Taoyuan Shien (TW)

(73) Assignee: Quanta Computer Inc., Tao Yuan Shien (TW)

( * ) Notice: Subject to any disclaimer, the term of this patent is extended or adjusted under 35 U.S.C. 154(b) by 280 days.

(21) Appl. No.: 14/070,324

(22) Filed: Nov. 1, 2013

(65) Prior Publication Data
US 2014/0293523 A1    Oct. 2, 2014

(30) Foreign Application Priority Data

Mar. 27, 2013   (TW) .............................. 102110932 A

(51) Int. Cl.
*H05K 5/02*    (2006.01)
*H05K 7/14*    (2006.01)

(52) U.S. Cl.
CPC .............. *H05K 7/1492* (2013.01); *H05K 7/14* (2013.01)

(58) Field of Classification Search
CPC .......... G06F 1/26; G06F 1/181; G06F 1/266;
G06F 1/189; G06F 1/188; G06F 1/183;
G06F 1/1601; G06F 1/263; G06F 1/184;
G06F 1/18; H05K 5/0204; H05K 7/14;
H05K 7/1489; H05K 7/1492; H05K 7/1431;
H05K 7/1457; H01R 2201/06; H01R 27/02;
Y10T 16/52; Y10T 16/54038; Y10T
29/49815; Y10T 70/40; Y10T 70/439;
Y10T 70/50

USPC .......... 361/679.4, 679.33–679.39, 728, 730, 361/736, 748, 752, 760; 312/223.1–223.2

See application file for complete search history.

(56) References Cited

U.S. PATENT DOCUMENTS

| | | | | |
|---|---|---|---|---|
| 5,754,396 A | * | 5/1998 | Felcman | G06F 1/18 361/679.6 |
| 9,095,070 B2 | * | 7/2015 | Ross | G11B 33/128 |
| 2006/0023422 A1 | | 2/2006 | Shum et al. | |
| 2008/0037209 A1 | | 2/2008 | Niazi et al. | |
| 2010/0027213 A1 | | 2/2010 | Wu et al. | |
| 2012/0243172 A1 | | 9/2012 | Ross et al. | |
| 2013/0141863 A1 | * | 6/2013 | Ross | H05K 7/1489 361/679.33 |

FOREIGN PATENT DOCUMENTS

| | | |
|---|---|---|
| JP | 06-350274 | 12/1994 |
| JP | 2012-243304 | 12/2012 |

* cited by examiner

*Primary Examiner* — Anthony Haughton
*Assistant Examiner* — Ingrid Wright
(74) *Attorney, Agent, or Firm* — Polsinelli PC

(57) ABSTRACT

A server rack and its server device are provided. The server device includes a chassis, a motherboard module, a power-supply module, a storage array module, and a plurality of input/output interface elements. The chassis is provided with a containing space, a first opening and a second opening in which the first opening and the second opening are located at two opposite ends of the containing space. The power-supply module and the motherboard module are both disposed in the containing space and are pluggable independently, are both capable of plugging in and out from the chassis via the first opening, and are electrically connected to each other. The input/output interface elements are fixed on the motherboard module, and all of them are disposed at the first opening. The storage array module is disposed in the containing space and is slidable.

15 Claims, 8 Drawing Sheets

SERVER RACK AND ITS SERVER DEVICE

CROSS-REFERENCE TO RELATED APPLICATIONS

This application claims priority to Taiwan Application Serial Number 102110932, filed Mar. 27, 2013, which is herein incorporated by reference.

FIELD OF THE INVENTION

The present disclosure relates to a server rack and server devices thereof. More particularly, the present disclosure relates to a server device which may be maintained and replaced from the front of the chassis.

BACKGROUND

In current server industry, the server rack generally includes plural server devices which may be pulled out from the front end. However, when a supervisor wants to maintain or replace the server devices, he needs to move to the rear end of the rack or the rack/the chassis needs to be taken apart so that the certain wires may be removed from the rear end of the server device and then some components may be taken out from the server device.

However, the requirement of the server maintaining service is usually emphasized on the rapid response, action and trouble shooting. Even the server device is pulled out and the chassis is disassembled very soon, it still takes time to remove the wires from the server device. These actions not only take time and cost, but also they are inconvenient for a user.

Therefore, it is a significant task to provide a design which may match the requirements above.

SUMMARY

One aspect of this disclosure is to provide a server rack and server devices thereof which are more easily maintained and replaced. The convenience of sever operating, component replacing, taking out modules, or removing wires may be improved such that the cost and time are saved.

According to one embodiment of this disclosure, a server device includes a chassis, a motherboard module, a power-supply module, a storage array module, and plural input/output interface elements. The chassis has a containing space, a first opening and a second opening, wherein the first opening and the second opening are located at two opposite ends of the containing space. The motherboard module is disposed in the containing space, is pluggable independently, and is capable of plugging in and out from the chassis via the first opening. The power-supply module is disposed in the containing space, is pluggable independently, is electrically connected to the motherboard module, and is capable of plugging in and out from the chassis via the first opening. The power-supply module includes a power port which is located in the first opening. The input/output interface elements are disposed on the motherboard module, are electrically connected to the motherboard module, and are disposed in the first opening.

In one or more embodiments of this disclosure, the chassis includes a first inner wall, a second inner wall, a splitting plate, a bottom surface and a first isolation body. The first inner wall is faced to the containing space. The second inner wall faces to the containing space and is opposite to the first inner wall. The splitting plate is connected to the first inner wall and the second inner wall and divides the containing space into an upper region and a lower region which is stacked each other. The bottom surface faces the containing space. The storage array module is located in the upper region. The lower region is located between the bottom surface and the upper region. The first isolation body is located on the bottom surface and divides the lower region into a first sub-region and a second sub-region which parallels each other. The motherboard module is located in the first sub-region of the lower region. The power-supply module is located in the second sub-region of the lower region.

In one or more embodiments of this disclosure, the chassis further includes a second isolation body. The second isolation body is connected to the first inner wall and the bottom surface. The second inner wall, the second isolation body, the splitting plate and the bottom surface define the lower region. The first isolation body, the second isolation body, the splitting plate and the bottom surface define the first sub-region. The second inner wall, the first isolation body, the splitting plate and the bottom surface define the second sub-region.

In one or more embodiments of this disclosure, the motherboard module includes a motherboard, plural electronic components and a first tray. The electronic components are disposed on the motherboard. The first tray is slidable in the first sub-region and carries the motherboard.

In one or more embodiments of this disclosure, the chassis further includes a first position limiting portion and a second position limiting portion. The first position limiting portion is disposed on one side of the first isolation body, wherein the side faces the first sub-region. The second position limiting portion is disposed on one side of the second isolation body, wherein the side faces the first sub-region. The second position limiting portion and the first position limiting portion limits the first tray to slide in the first sub-region linearly.

In one or more embodiments of this disclosure, the splitting plate has a position limiting rib extending to the bottom surface. The position limiting rib is connected to the second inner wall. The power-supply module includes a housing and a power control board. The housing is slidable in the second sub-region. The power control board is disposed in the housing. The position limiting rib and the first isolation body limit the housing to slide in the second sub-region linearly.

In one or more embodiments of this disclosure, the motherboard module includes at least one first tool-less connector. The chassis further includes a first adapter board which is mounted in the containing space. The first adapter board has at least one third tool-less connector. When the motherboard module is plugged into the chassis from the first opening, the first tool-less connector is electrically coupled to the third tool-less connector and is pluggable.

In one or more embodiments of this disclosure, the power-supply module further includes at least one second tool-less connector. The chassis further includes a second adapter board which is mounted in the containing space of the chassis. The second adapter board is electrically connected to the first adapter board and has at least one forth tool-less connector. When the power-supply module is plugged into the chassis from the first opening, the second tool-less connector is electrically coupled to the forth tool-less connector and is pluggable.

In one or more embodiments of this disclosure, the server device further includes a storage array module. The storage array module is slidable in the upper region of the containing space and may be pulled out from the first opening of the chassis.

In one or more embodiments of this disclosure, the chassis includes a first outer rail and a second outer rail. The first outer rail is disposed on a portion of the first inner wall, wherein the portion faces the upper region. The second outer rail is disposed on a portion of the second inner wall, wherein the portion faces the upper region.

In one or more embodiments of this disclosure, the storage array module includes two storage arrays, a second tray, a first middle rail, a second middle rail, a first inner rail and a second inner rail. Each of the storage arrays includes a storage array back board and plural disk devices. The disk devices are electrically connected to the storage array back board and are electrically connected to the motherboard module thereby. A bottom portion of the second tray carries the storage arrays. The bottom portion further has a hollow portion and the two storage arrays are disposed on the opposite sides of the hollow portion respectively. The first middle rail is slidable and connected to the first outer rail. The second middle rail is slidable and connected to the second outer rail. The first inner rail is disposed on one side of the second tray, is slidable, and connected to the first middle rail. The second inner rail is disposed on the other side of the second tray, is slidable, and connected to the second middle rail.

In one or more embodiments of this disclosure, the chassis further includes a wire protection chain. The wire protection chain is consisted of plural chain units which are joined each other in series. Each of the chain units has a hollow portion and all the hollow portions are connected to each other to form a wire passing channel. The storage array module includes plural wires which are passed the wire passing channel and connected to the disk devices and the motherboard module.

In one or more embodiments of this disclosure, the server device further includes plural signal wires. The signal wires are plugged into the input/output interface elements respectively, and passed through the first opening from the chassis.

Another aspect of this disclosure is providing a server rack. The server rack includes a rack and plural server devices mentioned above, wherein the server devices are stacked each other in the rack.

Therefore, according to the server rack and the design of the server devices in this disclosure, before the server devices are maintained or surveyed, the supervisor may proceed operating, replacing, plugging out or removing wires for the sever devices from the front end of the server rack. Because it is not necessary to moving to the rear end of the server rack or to disassemble the server rack in order to remove the wires, the time of maintenance and inspection is saved.

These and other features, aspects, and advantages of the present disclosure will become better understood with reference to the following description, accompanying drawings and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
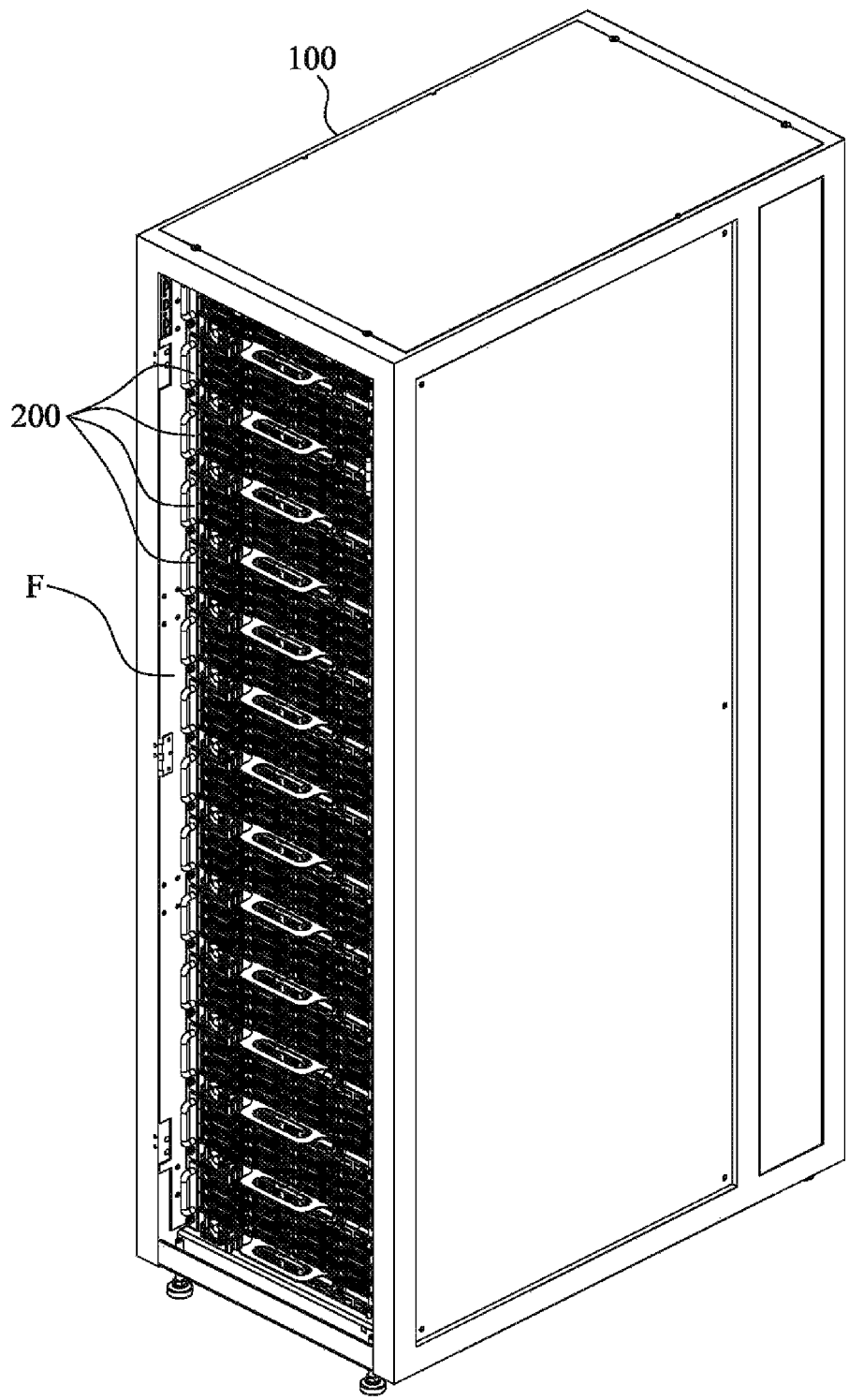
FIG. 1 is a perspective view of a server rack according to this disclosure.

Reference will now be made in detail to the present embodiments of the disclosure, examples of which are illustrated in the accompanying drawings. Wherever possible, the same reference numbers are used in the drawings and the description to refer to the same or like parts. Further, the foregoing has outlined features of several embodiments so that those skilled in the art can better understand the detailed description that follows. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they can make various changes, substitutions and alterations herein without departing from the spirit and scope of the present disclosure.

FIG. 1 is a perspective view of a server rack SC according to this disclosure.

Referring to FIG. 1, the server rack SC (also named server cabinet) of this disclosure includes a rack 100 which may receive plural server devices 200. In practically, one side of the rack 100 has a rectangle slot F so that these server devices 200 may be stacked and mounted in the rectangle slot F, for example, in one row. However, this disclosure is not limited to the arrangement above.

Figure 2:
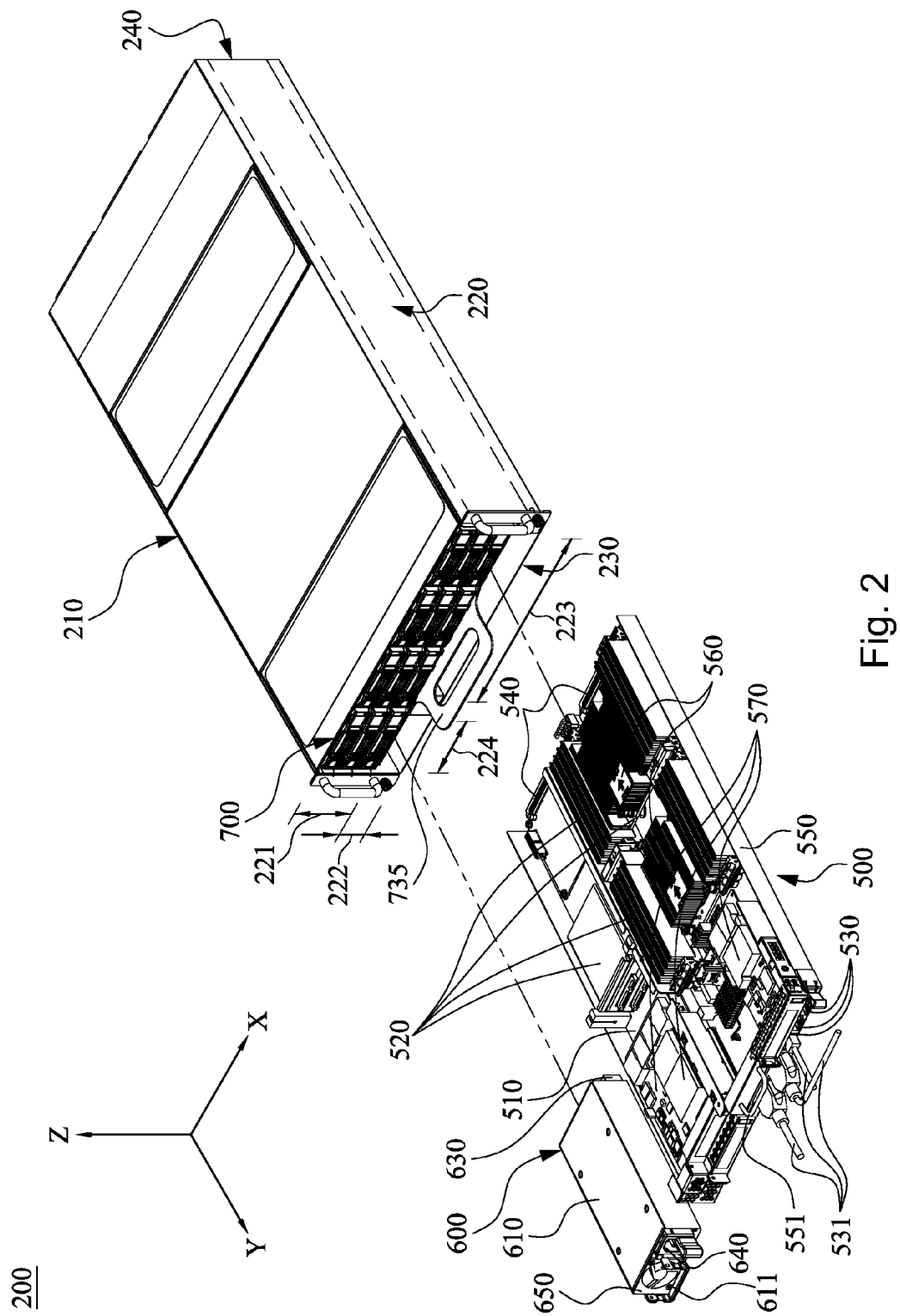
FIG. 2 is a perspective view of a server device with the motherboard module and the power-supply module detached according to this disclosure.
Figure 3:
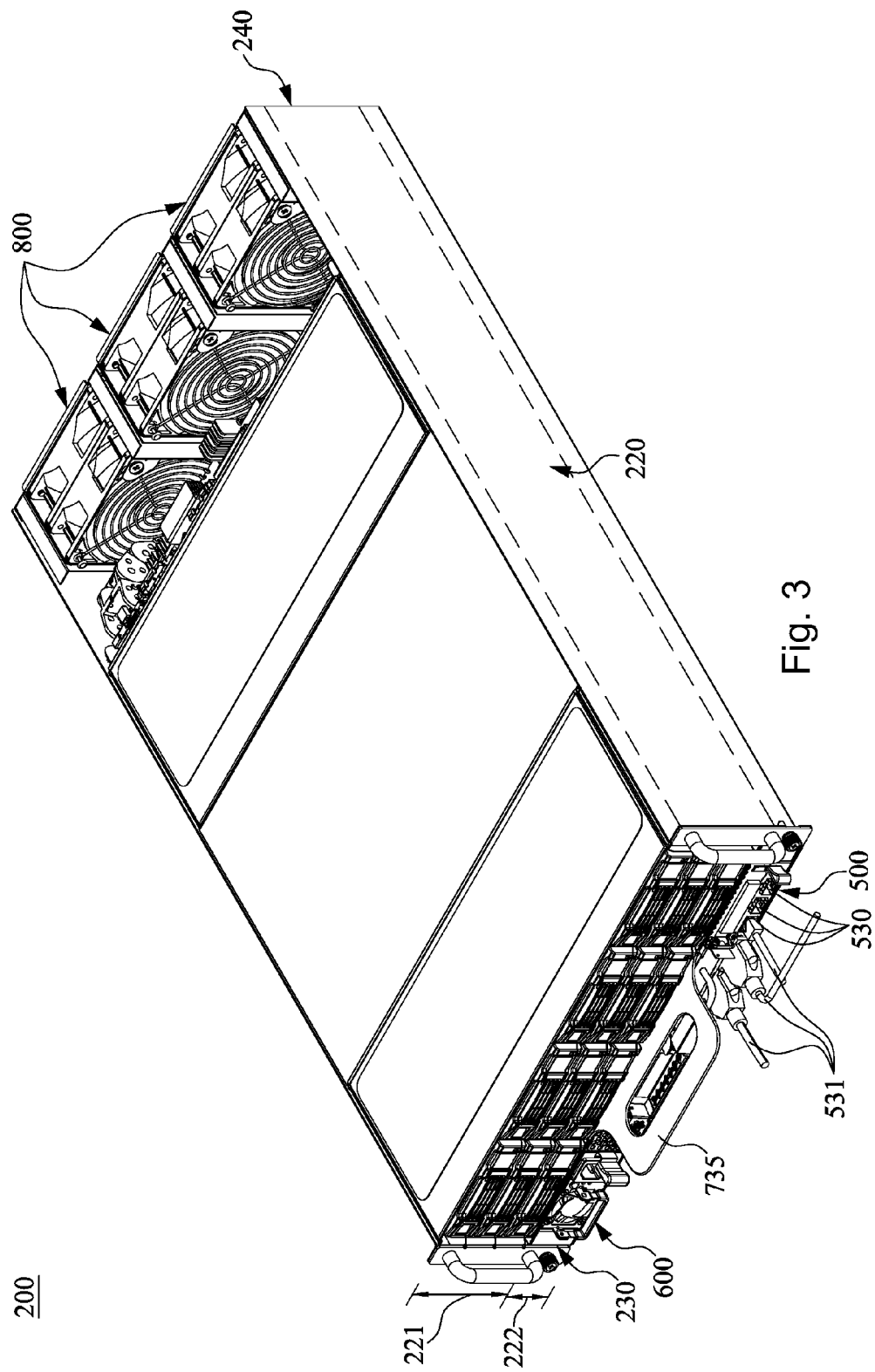
FIG. 3 is a perspective view of a server device with the motherboard module and the power-supply module plugged according to this disclosure.

FIG. 2 is a perspective view of a server device 200 with the motherboard module 500 and the power-supply module 600 detached according to this disclosure. FIG. 3 is a perspective view of a server device 200 with the motherboard module 500 and the power-supply module 600 plugged according to this disclosure.

In some embodiments of this disclosure, as shown in FIG. 2 and FIG. 3, each of the server devices 200 includes a chassis 210, a motherboard module 500, a power-supply module 600, and plural input/output interface elements 530. The chassis is 210 in form of a cuboid and mounted in the rack 100 (as shown in FIG. 1). The chassis 210 has a containing space 220, a first opening 230 and a second opening 240, wherein the first opening 230 and the second opening 240 are located at two opposite ends of the containing space 220. The containing space 220 is connected to the outer space of the chassis 210 through the first opening 230 and the second opening 240. The motherboard module 500 is disposed in the containing space 220, and is pluggable independently. The motherboard module 500 is capable of plugged into the chassis 210 along the Y axis (as shown in FIG. 3) or plugged out from the chassis 210 (as shown in FIG. 2) via the first opening 230. The power-supply module 600 is disposed in the containing space 220, is pluggable independently, and is electrically connected to the motherboard module 500. The power-supply module 600 is capable of plugged into the chassis 210 along the Y axis (as shown in FIG. 3) or plugged out from the chassis 210 (as shown in FIG. 2) via the first opening 230. The input/output interface elements 530 are disposed on the motherboard module 500, and are electrically connected to the motherboard module 500. All of the input/output interface elements 530 are disposed in the first opening 230. For example, the input/output interface elements 530 may be exposed outside the chassis 210 from the first opening 230 or not exposed so that the signal wires 531 which are plugged into portion or all of the input/output interface elements 530 may extend outside the chassis 210 from the first opening 230. The power-supply module 600 includes a power port 640 which is located in the first opening 230. For example, the power port 640 may be exposed outside the chassis 210 from the first opening 230 or not exposed so that the power line (not shown) which is plugged into the power port 640 may extend outside the chassis 210 from the first opening 230.

Therefore, according to the design above, before the server devices 200 are maintained or surveyed, the supervisor may proceed operating, replacing, plugging out or removing the signal wires 531 which are plugged into portion or all of the input/output interface elements 530 and the power line which is plugged into the power port 640 for the sever devices 200 from the near first opening 230. Because it is not necessary to moving to the rear end of the server device 200 or the server rack 100, or to disassemble the server rack 100 in order to remove the wires, the time of maintenance and inspection is saved.

In one embodiment of this disclosure, the server device 200 further includes plural fan modules 800 (as shown in FIG. 3). All of the fan modules 800 are disposed in the second opening 240 in parallel. The fan modules 800 are utilized to enhance the air convection between the containing space 220 and the second opening 240. However, the fan modules 800 are optional components in this disclosure.

Figure 4:
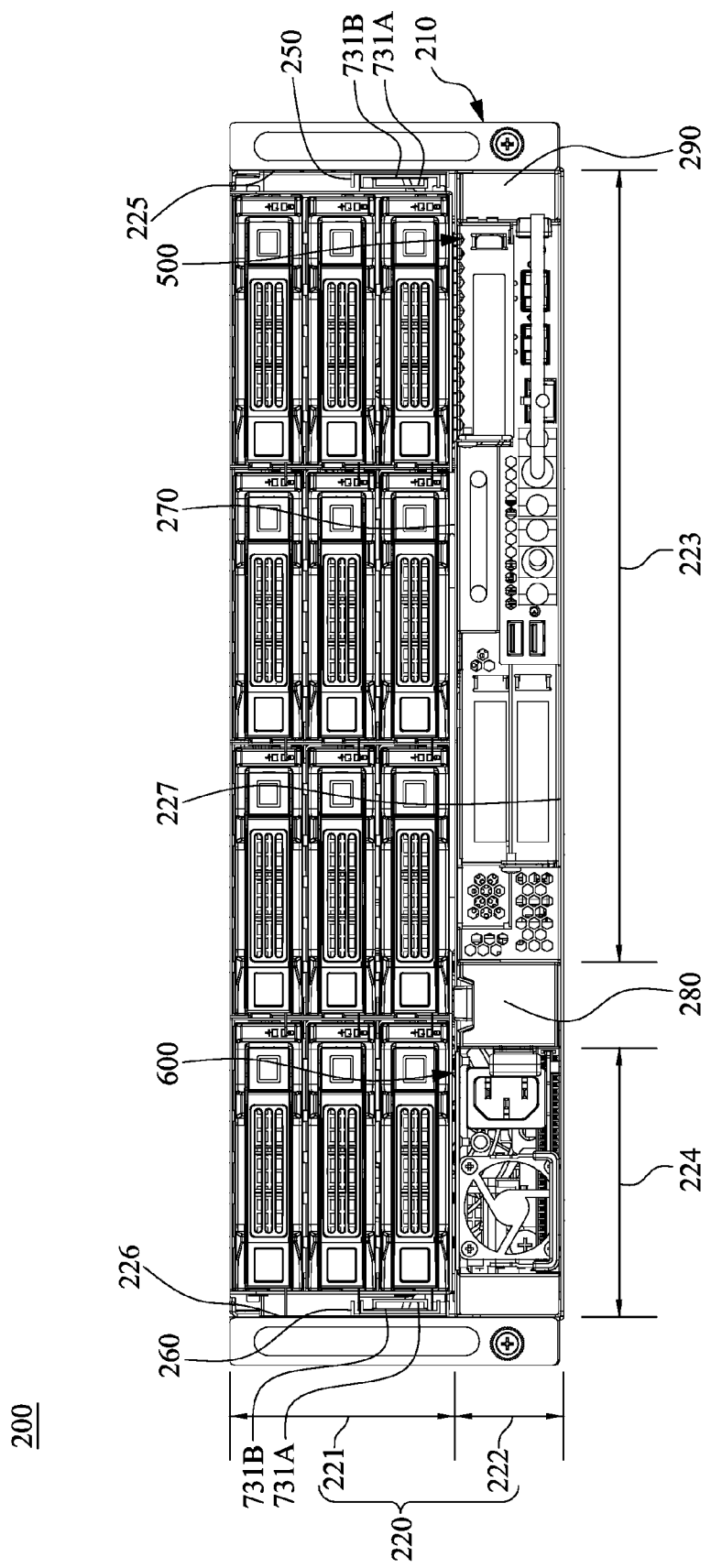
FIG. 4 is a front view of the server device viewed from the first opening, with the server device plugged according to this disclosure.

FIG. 4 is a front view of the server device 200 viewed from the first opening 230, with the server device 200 plugged according to this disclosure.

In this embodiment, the motherboard module 500 and power-supply module 600 are disposed in parallel in the containing space 200 so that each of them may be detached from the chassis 210 independently.

Referring to FIG. 2 and FIG. 4, in more detail, the chassis 210 includes a splitting plate 270, a bottom surface 227, a first inner wall 225 and a second inner wall 226 which is opposite to the first inner wall 225. The containing space 220 is between the first inner wall 225 and the second inner wall 226 such that both of the first inner wall 225 and the second inner wall 226 face the containing space 220. The splitting plate 270 is connected to the first inner wall 225 and the second inner wall 226 and divides the containing space 220 into an upper region 221 and a lower region 222 which is stacked each other. The chassis 210 further includes a first isolation body 280. The first isolation body 280 is located on the bottom surface 227 and divides the lower region 222 into a first sub-region 223 and a second sub-region 224 which parallels each other. When the motherboard module 500 is plugged into the chassis 210, the motherboard module 500 is located in the first sub-region 223 of the lower region 222. When the power-supply module 600 is plugged into the chassis 210, the power-supply module 600 is located in the second sub-region 224 of the lower region 222.

In the embodiment, the chassis 210 further includes a second isolation body 290. The second isolation body 290 is connected to the first inner wall 225 and the bottom surface 227. The second inner wall 226, the second isolation body 290, the splitting plate 270 and the bottom surface 227 define the lower region 222. The first isolation body 280, the second isolation body 290, the splitting plate 270 and the bottom surface 227 define the first sub-region 223. The second inner wall 226, the first isolation body 280, the splitting plate 270 and the bottom surface 227 define the second sub-region 224.

However, this disclosure is not limited to the arrangement above. The person with ordinary knowledge in the art may optionally utilize the second isolation body 290 according to the requirement.

Referring to FIG. 2 again, the motherboard module 500 includes a first tray 550, a motherboard 510, plural electronic components 520 and plural thermal fins 560. The first tray 550 is slidable in the first sub-region 223 and carries the motherboard 510.

The electronic components 520 are disposed on the motherboard 510. For example, the electronic components 520 may be a Center Processing Unit (CPU), a Graphic Processing Unit (GPU), a communication interface unit, a disk unit or plural memory units. The electronic components 520 are electrically connected to the motherboard 510. The thermal fins 560 are attached on the CPU. The input/output interface elements 530, for example, may be a display port, a network port or a USB port and so on. The input/output interface elements 530 are mounted on one end of the motherboard 510, electrically coupled to the motherboard 510 and exposed on one end of the first tray 550.

It is worth noting that the motherboard module 500 not only limited to include a single node. The motherboard module 500 may include three or more nodes and is received in the first sub-region 223.

Besides, in order to detach the motherboard 500 from the chassis 210 more easily, the first tray 550 further includes a first handle 551. The first handle 551 is disposed on the first tray 550 and exposed on one end of the first tray 550. Thus, when the motherboard module 500 is plugged into the chassis 210 along the Y axis, the first handle 551 is exposed outside the chassis 210 so that the supervisor may move the motherboard module 500 by holding the first handle 551.

Figure 5:
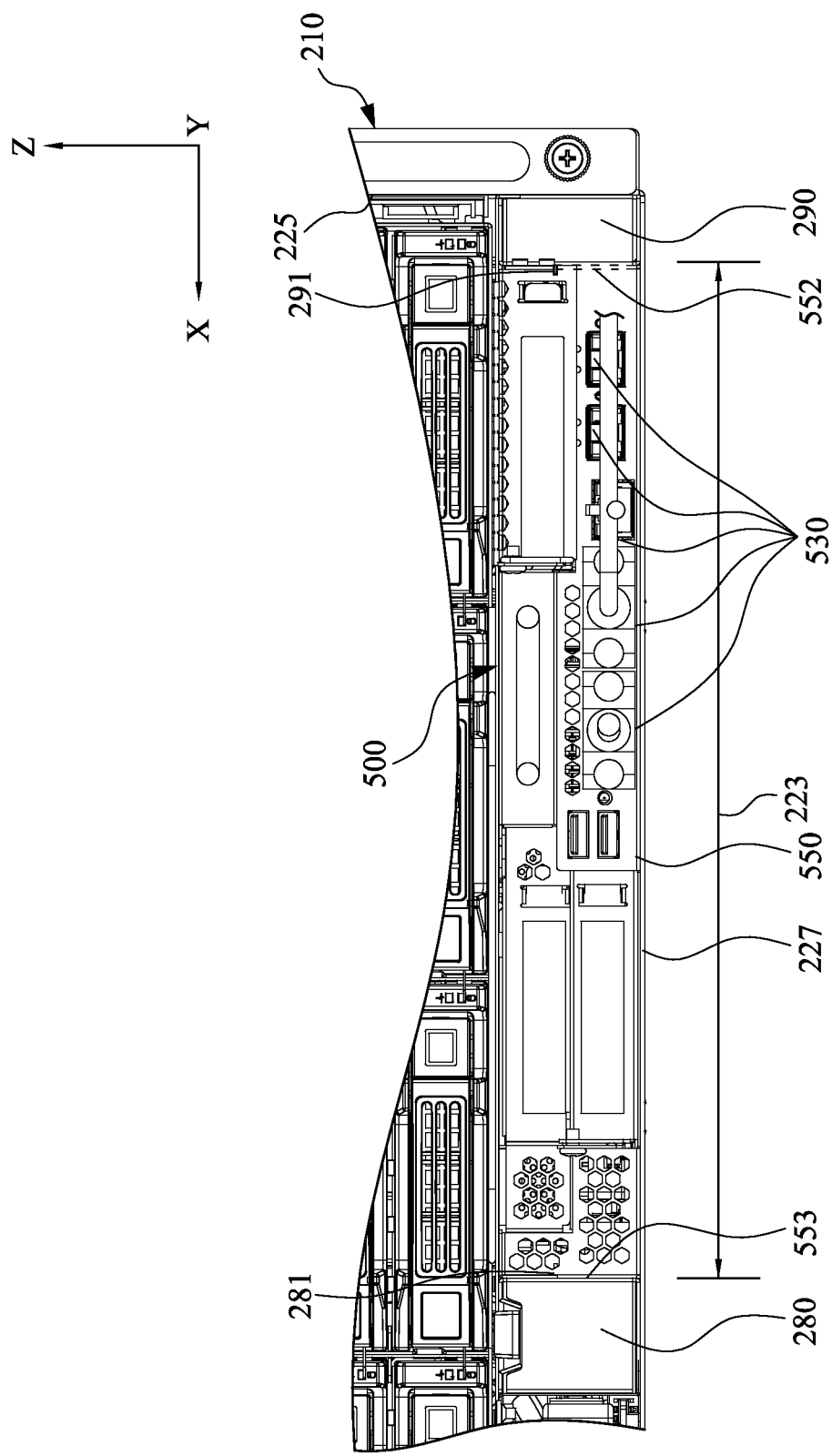
FIG. 5 is a partial enlarged drawing of the first sub-region in FIG. 4.

FIG. 5 is a partial enlarged drawing of the first sub-region 223 in FIG. 4. When the motherboard module 500 is plugged into the chassis 210 along the Y axis, the first tray 550 is disposed on the bottom surface 227 and restricted between the first isolation body 280 and the second isolation body 290. Accordingly, the first tray 550 is restricted not to move along the X axis. Furthermore, the chassis 210 further includes a first position limiting portion 281 and a second position limiting portion 291. The first position limiting portion 281 is disposed on one side of the first isolation body 280, wherein the side faces one side of the first sub-region 223, and extends to the first sub-region 223 horizontally (i.e. right direction along the X axis). The second position limiting portion 291 is disposed on one side of the second isolation body 290, wherein the side faces one side of the first sub-region 223 and extends to the first sub-region 223 horizontally (i.e. left direction along the X axis).

Therefore, when the motherboard module 500 is plugged into the chassis 210 along the Y axis, the first tray 550 is disposed on the bottom surface 227. At this moment, the first position limiting portion 281 is touched the upper edge of one side 552 of the first tray 550, while the second position limiting portion 291 is touched the upper edge of the other side 553 of the first tray 550. Accordingly, the first tray 550 is restricted to slide in the first sub-region 223 linearly by the first position limiting portion 281, the second position limiting portion 291 and the bottom surface 227 so that the first tray 550 is restricted not to move along the Z axis.

It should be understood that the first position limiting portion 281 may be a single one or plural ones disposed in parallel. Otherwise, the first position limiting portion 281 may be integrated with the first isolation body 280 or attached to the first isolation body 280. The second position limiting portion 291 may be a single one or plural ones disposed in parallel. Otherwise, the second position limiting portion 291 may be integrated with the second isolation body 290 or attached to the first isolation body 290.

Figure 6:
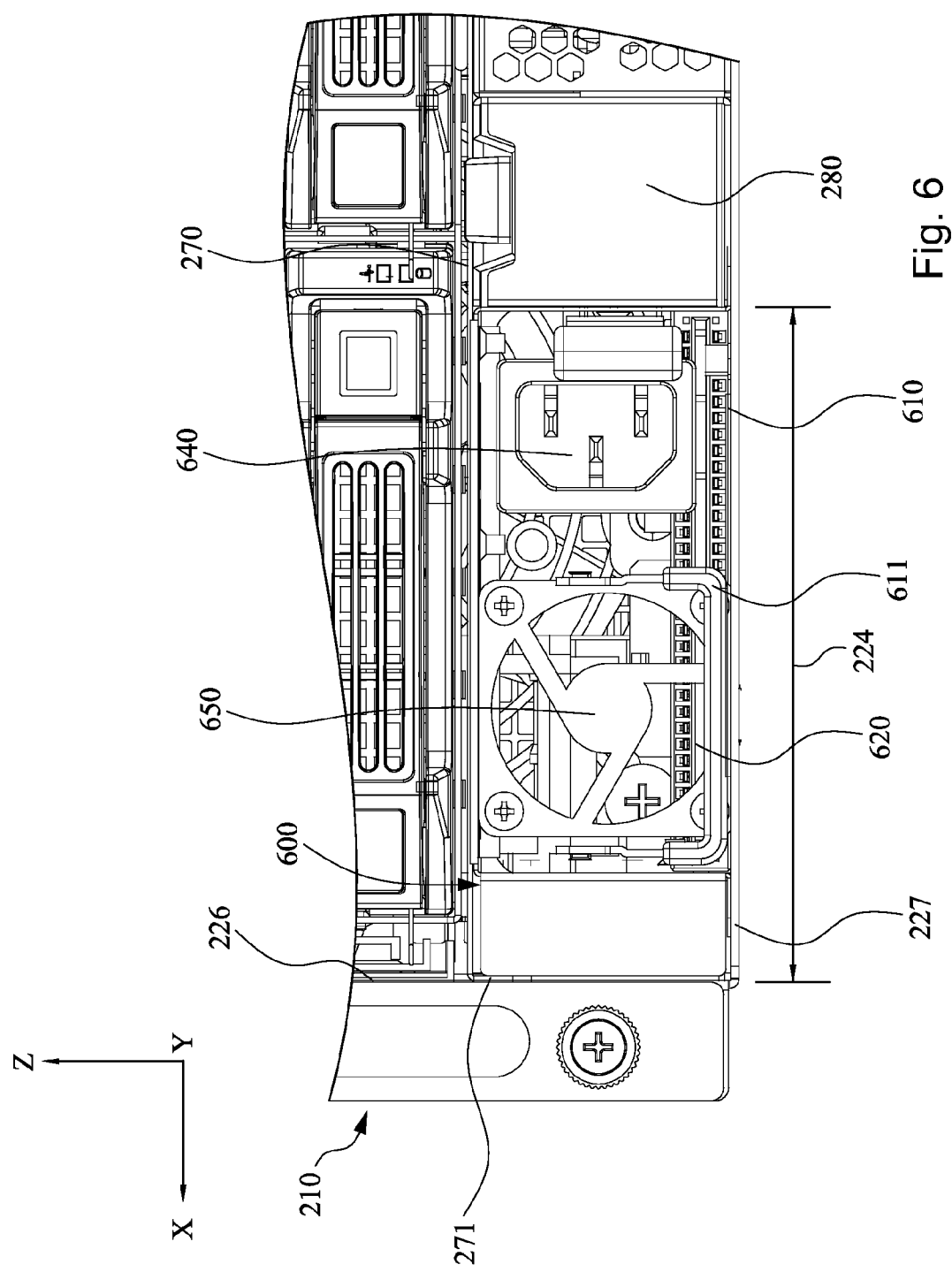
FIG. 6 is a partial enlarged drawing of the second sub-region in FIG. 4.

FIG. 6 is a partial enlarged drawing of the second sub-region 224 in FIG. 4. Referring to FIG. 2 and FIG. 6, the power-supply module 600 includes a housing 610, a power control board 620 (shown in FIG. 6), a power fan 650 and plural power related components (not shown). The housing 610 is slidable in the second sub-region 224. The power control board 620 and the power related components are disposed in the housing. These power related components, for example, may be a frequency booster, a frequency reducer, or a AC/DC converter and the like. The power control board 620 is utilized to control the quantity of power output (voltage or current) by controlling the power related components. The power port 640 is disposed on one end of the housing and, for example, exposed outside the housing 610. The power port 640 is electrically coupled to the power control board 620, the power fan 650 and the power related components. The power fan 650 is disposed in the housing 610 and exposed outside one end of the housing 610, wherein the power fan 650 and the power port 640 is disposed on the same end of the housing 610. The power fan 650 is utilized to provide air convection and to dissipate the heat in the housing 610.

Moreover, in order to detach the power-supply module 600 from the chassis 210 more easily, the housing 610 further includes a second handle 611. The second handle 611 is disposed on one end of the housing 610, wherein the end exposes the power port 640. Thus, when the power-supply module 600 is plugged into the chassis 210 along the Y axis, the second handle 611 is exposed outside the chassis 210 so that the supervisor may move the power-supply module 600 by holding the second handle 611.

Referring to FIG. 6, the splitting plate 270 protrudes a position limiting rib 271 facing the bottom surface 227 (i.e. down direction along the Z axis). The position limiting rib 271 is connected to the second inner wall 226. Thus, when the power-supply module 600 is plugged into the chassis 210 along the Y axis, the housing 610 of the power-supply module 600 is disposed on the bottom surface 227. The power-supply module 600 is restricted not to move along the X axis by the position limiting rib 271 and the first isolation body 280 and is restricted not to move along the Z axis by the bottom surface 227 and the splitting plate 270. Accordingly, the housing 610 of the power-supply module 600 is restricted to slide in the second sub-region 224 linearly along the Y axis by the position limiting rib 271, the first isolation body 280, the bottom surface 227 and the splitting plate 270.

Figure 7:
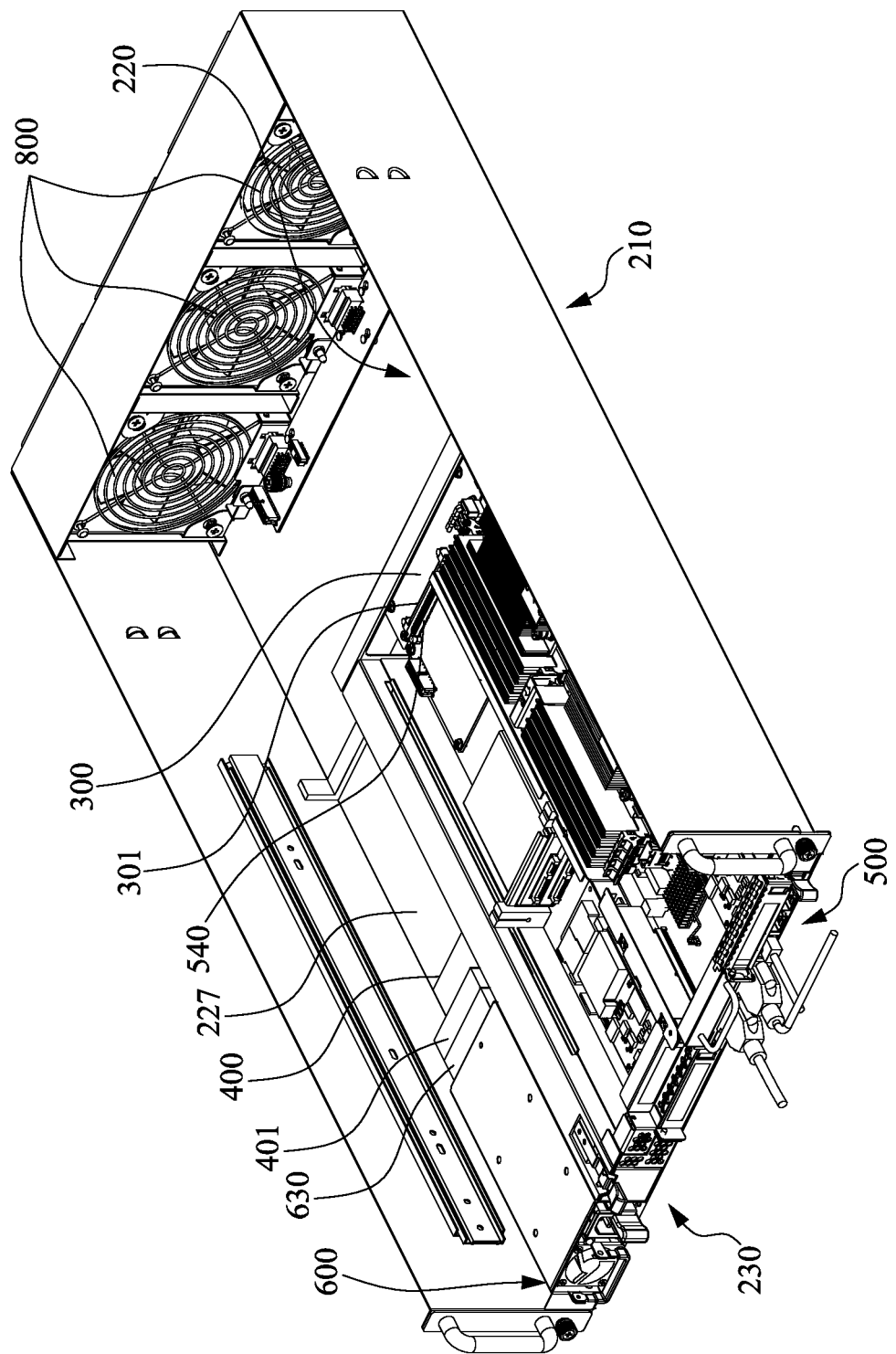
FIG. 7 is a schematic drawing of the server device with the motherboard module and the power-supply module electrically connected to each other in the chassis according to this disclosure.

FIG. 7 is a schematic drawing of the server device 200 with the motherboard module 500 and the power-supply module 600 electrically connected to each other in the chassis 210 according to this disclosure. Referring to FIG. 2 and FIG. 7, the motherboard module 500 includes at least one first tool-less connector 540. The first tool-less connector 540 is disposed on one end of the motherboard 510, wherein the end is far from the input/output interface unit 530. The power-supply module 600 includes at least one second tool-less connector 630. The second tool-less connector 630 is disposed on one end of the housing 610, wherein the end is far from the power port 640. The second tool-less connector 630 is electrically coupled to the power port 640.

The chassis 210 further includes a first adapter board 300 and a second adapter board 400. The first adapter board 300 is mounted in the containing space 220 and has at least one third tool-less connector 301. The second adapter board 400 is mounted in the containing space 220, is electrically coupled to the first adapter board 300 by wires, and has at least one forth tool-less connector 401. In more detail, the first adapter board 300 is mounted on the bottom surface 227 of the chassis 210 and is located in the first sub-region 223. The third tool-less connector 301 of the first adapter board 300 faces the first opening 230 to receive the first tool-less connector 540 of the motherboard module 500. The second adapter board 400 is mounted on the bottom surface 227 of the chassis 210 and is located in the second sub-region 224. The forth tool-less connector 401 of the second adapter board 400 faces the first opening 230 to receive the second tool-less connector 630 of the power-supply module 600.

As shown in FIG. 7, when the motherboard module 500 is plugged into the chassis 210 along the Y axis, the first tool-less connector 540 is electrically coupled to the third tool-less connector 301 and is pluggable such that the motherboard module 500 is electrically coupled to the first adapter board 300. When the power-supply module 600 is plugged into the chassis 210 along the Y axis, the second tool-less connector 630 is electrically coupled to the forth tool-less connector 401 and is pluggable such that the power-supply module 600 is electrically coupled to the second adapter board 400. The power-supply module 600 is electrically coupled to the motherboard module 500 through the first adapter board 300 and the second adapter board 400 and is utilized to provide the power as required. Furthermore, the second adapter board 400 is electrically coupled to the fan module 800 by wires (not shown). When the power-supply module 600 is electrically coupled to the second adapter board 400, the second adapter board 400 provides power to the fan module 800 as required.

Figure 8:
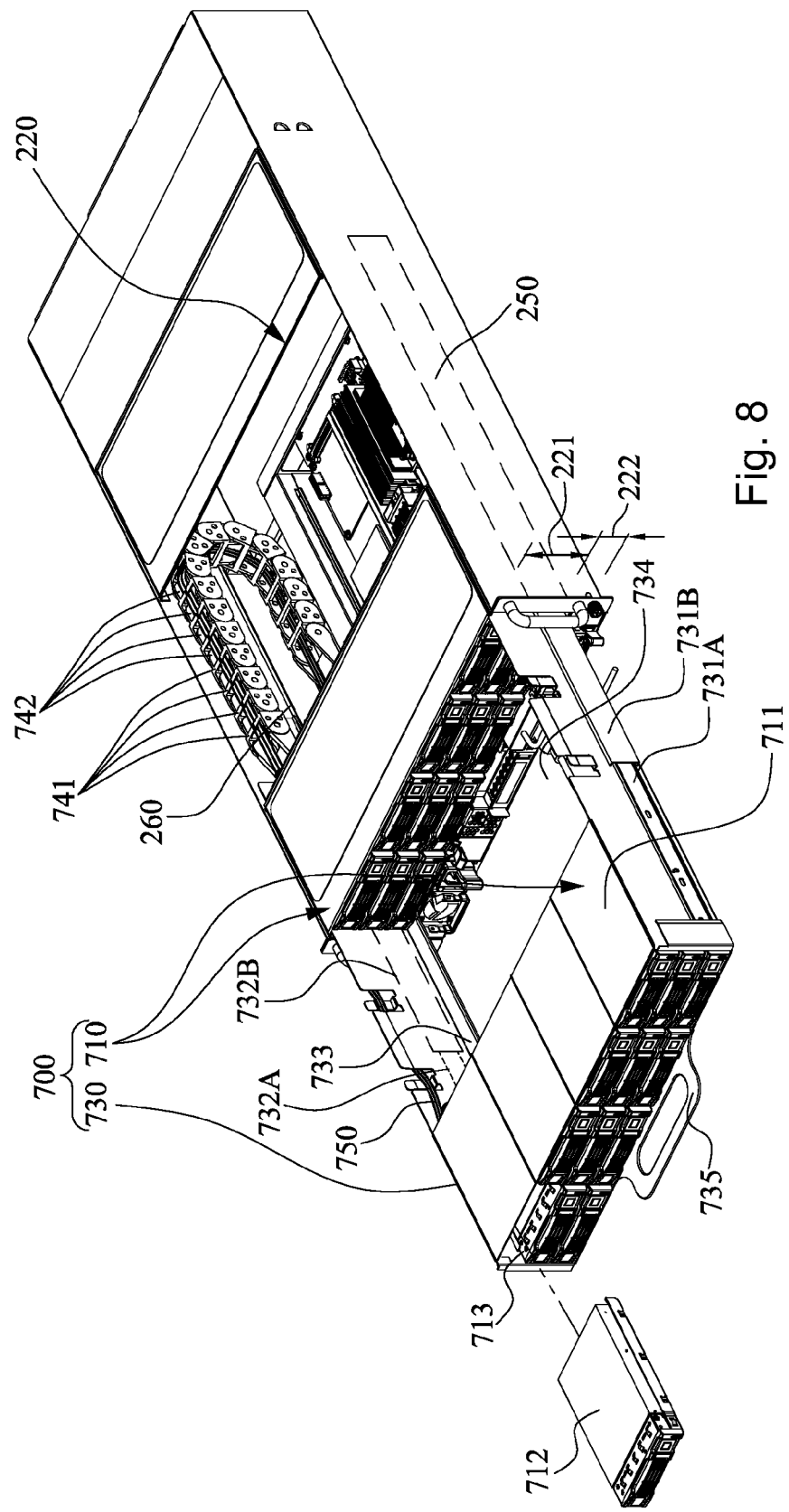
FIG. 8 is a perspective view of the server device with the storage array module pulled out according to this disclosure.

FIG. 8 is a perspective view of the server device 200 with the storage array module 700 pulled out according to this disclosure.

Referring to FIG. 4 and FIG. 8, the server device 200 further includes a storage array module 700. The storage array module 700 is slidable in the containing space 220. The storage array module 700 may be pushed in or pulled out from the chassis 210 through the first opening 230. The storage array module 700 is slidable in the upper region 221 of the containing space 220.

For example, in one embodiment of this disclosure, as shown in FIG. 4 and FIG. 8, the chassis 210 includes a first outer rail 250 and a second outer rail 260. The first outer rail 250 is disposed on a portion of the first inner wall 225, wherein the portion faces the upper region 221. The second outer rail 260 is disposed on a portion of the second inner wall 226, wherein the portion faces the upper region 221. The storage array module 700 includes a second tray 730, two storage arrays 710. The second tray 730 carries the storage arrays 710. The storage array module 700 further includes a first inner rail 731A, a second inner rail 732A, a first middle rail 731B, and a second middle rail 732B. The first inner rail 731A and the second inner rail 732A are located on two opposite outer walls of the second tray 730 respectively. The first middle rail 731B is connected to the first inner rail 731A and the first outer rail 250. The second middle rail 732B is connected to the second inner rail 732A and the second outer rail 260.

Accordingly, by the first inner rail 731A connected to the first middle rail 731B, the first middle rail 731B connected to the first outer rail 250, the second inner rail 732A connected to the second middle rail 732B and the second middle rail 732B connected to the second outer rail 260, the second tray 730 may slide in the containing space 220.

Moreover, in order to detach the storage array module 700 from the chassis 210 more easily, the second tray 730 further includes a third handle 735. The third handle 735 is disposed on one end of the second tray 730. Thus, when the storage array module 700 is pushed into the chassis 210, the third handle 735 is exposed outside the chassis 210 so that the supervisor may move the storage array module 700 by holding the third handle 735.

Referring to FIG. 2 and FIG. 8, each of the storage arrays 710 includes a storage array back board 720 and plural disk devices 711. The disk devices 711 are arranged in array (in 3*4 array, as shown in FIG. 8) and are stacked on the second tray 730. In more detail, each of the disk devices 711 includes a disk 712 and a disk slot 713. The disk 712 is disposed in the disk slot 713 and is detachable. The disk 712 is electrically connected to the storage array back board 720 through the connector (not shown) in the disk slot 713. Therefore, the disk 712 may be replaced as required. Besides, the motherboard module 500 further includes plural control interface cards 570 (e.g. three control interface cards), wherein two control interface cards 570 are horizontally stacked on one side of the motherboard 510 and are received in the first sub-region 223. The control interface cards 570 are connected to the motherboard 510 and the storage arrays 710 of the storage array module 700 so that the control interface cards 570 may control the signal transmission between the motherboard 510 and the storage arrays 710 of the storage array module 700.

Moreover, the disk devices 711 are electrically coupled to the motherboard module 500 through the storage array back board 720. In more detail, the disk devices 711 are electrically coupled to the motherboard module 500 by at least one wire 750 respectively. The one end of the wire 750 is electrically connected to the storage array back board 720 of the storage arrays 710, and is electrically connected to the disk device 711 by the storage array back board 720. The other end of the wire 750 is electrically connected to the first adapter board 300 and is electrically connected to the motherboard module 500 by the first adapter board 300.

Referring to FIG. 2 and FIG. 8, the second tray 730 carries the storage arrays 710 by the bottom portion 733. The bottom portion 733 of the second tray 730 has at least one hollow portion 734. The bottom portion 733 of the second tray 730 has one hollow portion 734 between every two adjacent storage arrays 710 so that the two storage arrays 710 are disposed on the opposite sides of the hollow portion 734 respectively. Therefore, when a sever device 200 is located at a higher position in the rack 100, any disk 712 of the storage array 710 which is far from the third handle 735 may be plugged out form the bottom portion 733 of the second tray 730 through the hollow portion 734.

It should be realized that the quantities of the storage arrays 710 (e.g. two) and the hollow portion 734 (e.g. one) mentioned above are only for example, and not to limit this disclosure. The person having ordinary knowledge in the art may flexibly select any proper quantity of storage arrays according to the requirement.

Referring to FIG. 8, the chassis 210 further includes a wire protection chain 740. The wire protection chain 740 is utilized to protect and collect portion of the wires 750 mentioned above. The wire protection chain 740 is consisted of plural chain units 741 which are joined each other in series. Each of the chain units 741 has a hollow portion 742 and all the hollow portions 742 are connected to each other to form a wire passing channel. Accordingly, the wires 750 may pass through the hollow portions 742 of the chain units 741 so that the wires 750 may be collected and protected by the wire protection chain 740.

Therefore, when the second tray 730 is pulled out or pushed into the first opening 230, the wire protection chain 740 may move with the second tray 730, wherein the chain units 741 may pivot each other to change the profile of the wire protection chain 740 and to fit the space.

To sum up, according to the server rack and the design of the server devices in this disclosure, before the server devices are maintained or surveyed, the supervisor may remove the signal wires of the input/output interface elements and the power lines of the power port from the first opening easily. Because it is not necessary to moving to the rear end of the server rack or to disassemble the server rack in order to remove the wires, the time of maintenance and inspection is saved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A server device, comprising:
   a chassis having a containing space, a first opening and a second opening, wherein the first opening and the second opening are located at two opposite ends of the containing space;
   a motherboard module disposed in the containing space, pluggable independently, and capable of plugging in and out from the chassis via the first opening;
   a power-supply module disposed in the containing space, pluggable independently, electrically connected to the motherboard module, and capable of plugging in and out from the chassis via the first opening, wherein the power-supply module comprises a power port which is located in the first opening; and
   a plurality of input/output interface elements disposed on the motherboard module, and electrically connected to the motherboard module, wherein all of the input/output interface elements are disposed in the first opening.

2. The server device of claim 1, wherein the chassis comprises:
   a first inner wall faced to the containing space;
   a second inner wall faced to the containing space and opposite to the first inner wall;

a splitting plate connected to the first inner wall and the second inner wall and dividing the containing space into an upper region and a lower region which is stacked each other;
a bottom surface faced the containing space, wherein the lower region is located between the bottom surface and the upper region; and
a first isolation body located on the bottom surface and dividing the lower region into a first sub-region and a second sub-region,
wherein the motherboard module is located in the first sub-region of the lower region, and wherein the power-supply module is located in the second sub-region of the lower region.

3. The server device of claim 2, wherein the chassis further comprises:
a second isolation body connected to the first inner wall and the bottom surface,
wherein the second inner wall, the second isolation body, the splitting plate and the bottom surface define the lower region, wherein the first isolation body, the second isolation body, the splitting plate and the bottom surface define the first sub-region, and wherein the second inner wall, the first isolation body, the splitting plate and the bottom surface define the second sub-region.

4. The server device of claim 3, wherein the motherboard module comprises:
a motherboard;
a plurality of electronic components disposed on the motherboard; and
a first tray slidable in the first sub-region and carrying the motherboard.

5. The server device of claim 4, wherein the chassis further comprises:
a first position limiting portion disposed on one side of the first isolation body, wherein the side faces the first sub-region; and
a second position limiting portion disposed on one side of the second isolation body, wherein the side faces the first sub-region, wherein the second position limiting portion and the first position limiting portion limits the first tray to slide in the first sub-region linearly.

6. The server device of claim 2, wherein the splitting plate has a position limiting rib extending to the bottom surface and the position limiting rib is connected to the second inner wall, the power-supply module comprises:
a housing slidable in the second sub-region; and
a power control board disposed in the housing,
wherein the position limiting rib and the first isolation body limit the housing to slide in the second sub-region linearly.

7. The server device of claim 2, wherein the server device further comprises:
a storage array module slidable in the upper region of the containing space and capable of being pulled out from the first opening of the chassis.

8. The server device of claim 7, wherein the chassis comprises:
a first outer rail disposed on a portion of the first inner wall, wherein the portion faces the upper region; and
a second outer rail disposed on a portion of the second inner wall, wherein the portion faces the upper region.

9. The server device of claim 8, wherein the storage array module comprises:

two storage arrays, wherein each of the storage arrays comprises a storage array back board and a plurality of disk devices, wherein the disk devices are electrically connected to the storage array back board and are electrically connected to the motherboard module thereby;
a second tray having a bottom portion carrying the two storage arrays, wherein the bottom portion further has a hollow portion and the two storage arrays are disposed on the opposite sides of the hollow portion respectively;
a first middle rail slidable and connected to the first outer rail;
a second middle rail slidable and connected to the second outer rail;
a first inner rail disposed on one side of the second tray, slidable, and connected to the first middle rail; and
a second inner rail disposed on the other side of the second tray, slidable, and connected to the second middle rail.

10. The server device of claim 9, wherein the chassis further comprises:
a wire protection chain consisted of a plurality of chain units which are joined each other in series, wherein each of the chain units has a hollow portion and all the hollow portions are connected to each other to form a wire passing channel, and
wherein the storage array module comprises a plurality of wires which are passed the wire passing channel and connected to the disk devices and the motherboard module.

11. The server device of claim 7, wherein the motherboard module comprises:
a plurality of control interface cards horizontally stacked on the motherboard module and electrically coupled to the motherboard and the storage array module.

12. The server device of claim 1, wherein the motherboard module comprises at least one first tool-less connector, wherein the chassis further comprises a first adapter board which is mounted in the containing space, wherein the first adapter board has at least one third tool-less connector, and
wherein, when the motherboard module is plugged into the chassis from the first opening, the first tool-less connector is electrically coupled to the third tool-less connector and is pluggable.

13. The server device of claim 12, wherein the power-supply module further comprises at least one second tool-less connector, wherein the chassis further comprises a second adapter board which is mounted in the containing space of the chassis, wherein the second adapter board is electrically connected to the first adapter board and has at least one forth tool-less connector, and
wherein, when the power-supply module is plugged into the chassis from the first opening, the second tool-less connector is electrically coupled to the forth tool-less connector and is pluggable.

14. The server device of claim 1, further comprising:
a plurality of signal wires plugged into the input/output interface elements respectively, and passed through the first opening from the chassis.

15. A server rack, comprising:
a rack; and
at least one of the server devices of claim 1, disposed in the rack.

* * * * *